(12) United States Patent
Yang et al.

(10) Patent No.: US 11,705,515 B2
(45) Date of Patent: Jul. 18, 2023

(54) GATE ELECTRODE EXTENDING INTO A SHALLOW TRENCH ISOLATION STRUCTURE IN HIGH VOLTAGE DEVICES

(71) Applicant: Taiwan Semiconductor Manufacturing Co., Ltd., Hsinchu (TW)

(72) Inventors: Yuan-Cheng Yang, Hsinchu (TW); Yun-Chi Wu, Tainan (TW); Shih-Jung Tu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/317,987

(22) Filed: May 12, 2021

(65) Prior Publication Data

US 2022/0285551 A1 Sep. 8, 2022

Related U.S. Application Data

(60) Provisional application No. 63/157,030, filed on Mar. 5, 2021.

(51) Int. Cl.
*H01L 29/78* (2006.01)
*H01L 29/66* (2006.01)
(Continued)

(52) U.S. Cl.
CPC ...... *H01L 29/7817* (2013.01); *H01L 29/0653* (2013.01); *H01L 29/42376* (2013.01); *H01L 29/66704* (2013.01)

(58) Field of Classification Search
CPC ............ H01L 29/7817; H01L 29/0653; H01L 29/42376; H01L 29/66704; H01L 29/66348; H01L 29/42356
(Continued)

(56) References Cited

U.S. PATENT DOCUMENTS 9,286,425 B2 * 3/2016 Anderson ........... H01L 27/1203
2008/0296667 A1 * 12/2008 Mikasa ............. H01L 29/66795
257/E21.409

(Continued)

OTHER PUBLICATIONS

Chen et al. "Robust ESD-Reliability Design of 300-V Power N-Channel LDMOSs with the Elliptical Cylinder Super-Junctions in the Drain Side." Electronics 2020, 9, 730; doi:10.3390/electronics9050730, published on Apr. 29, 2020.
(Continued)

*Primary Examiner* — Calvin Y Choi
(74) *Attorney, Agent, or Firm* — Eschweiler & Potashnik, LLC (57) ABSTRACT

In some embodiments, the present disclosure relates to an integrated chip that includes a source region and a drain region arranged over and/or within a substrate. Further, a shallow trench isolation (STI) structure is arranged within the substrate and between the source and drain regions. A gate electrode is arranged over the substrate, over the STI structure, and between the source and drain regions. A portion of the gate electrode extends into the STI structure such that a bottommost surface of the portion of the gate electrode is arranged between a topmost surface of the STI structure and a bottommost surface of the STI structure.

20 Claims, 9 Drawing Sheets

(51) Int. Cl.
*H01L 29/423* (2006.01)
*H01L 29/06* (2006.01)

(58) Field of Classification Search
USPC .......................................................... 257/343
See application file for complete search history.

(56) References Cited

U.S. PATENT DOCUMENTS

2014/0042555 A1* 2/2014 Takaishi .............. H01L 29/7827
257/401
2019/0305129 A1* 10/2019 Uda .................... H01L 29/0607

OTHER PUBLICATIONS

Liu et al. "Hot-Carrier-Induced Degradations and Optimizations for Lateral DMOS Transistor With Multiple Floating Poly-Gate Field Plates." IEEE Transactions on Electron Devices, vol. 64, No. 8, Aug. 2017, published on Jun. 14, 2017.
Liu et al. "A Novel High-Voltage LDMOS With Shielding Contact Structure for HCI SOA Enhancement." Proceedings of the 29th International Symposium on Power Semiconductor Devices &ICs, Sapporo. Published on Jul. 24, 2021.
Srinivasan, Karthik. "Better PMIC Design Using Multi-Physics Simulation." Ansys-Apache, 2016, published on Jul. 14, 2016.
Kasai et al. "Investigation of the Breakdown Voltage Degradation under Hot-Carrier Injection in STI-based PchLDMOS Transistors." 2020 32nd International Symposium on Power Semiconductor Devices and ICs (ISPSD), Vienna, Austria, 2020, pp. 427-430, doi: 10.1109/ISPSD46842.2020. 9170073, published on Aug. 18, 2020.

* cited by examiner

GATE ELECTRODE EXTENDING INTO A SHALLOW TRENCH ISOLATION STRUCTURE IN HIGH VOLTAGE DEVICES

REFERENCE TO RELATED APPLICATION

This Application claims the benefit of U.S. Provisional Application No. 63/157,030, filed on Mar. 5, 2021, the contents of which are hereby incorporated by reference in their entirety.

BACKGROUND

As technology advances at a rapid pace, engineers work to make devices smaller, yet more complex to improve and develop electronic devices that are more efficient, more reliable, and have more capabilities. One way to achieve these goals is by improving the design of transistors, as electronic devices comprise a plethora of transistors that together, carry out the function of the device. Overall electronic device performance may benefit from transistors that, for example, are smaller, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A laterally-diffused metal-oxide semiconductor (LDMOS) transistor is a high voltage device commonly used in high voltage applications such as amplifiers, power management integrated circuits (PMICs), or the like. An LDMOS transistor has a high breakdown voltage, which increases the reliability of high voltage devices. To increase the switching speeds of the transistor, the amount of resistance within the channel region, known as the "drain-source on resistance", or $R_{DS(on)}$, can be reduced. There are many factors that influence the value of $R_{DS(on)}$, such as, for example, the channel region area, the diffusion resistance in the source and drain, the resistance of the substrate, and the temperature of the transistor. Adjusting these factors to improve transistor current may impose other functional and design challenges.

In some instances, an LDMOS transistor comprises a gate electrode arranged over a substrate, wherein the gate electrode is arranged between a source region and a drain region. In some embodiments, the source and drain regions are arranged within the substrate and/or are arranged over the substrate. In some embodiments, because the drain region is exposed to such high voltages, a shallow trench isolation (STI) structure is arranged below the gate electrode within the substrate. The STI structure is arranged closer to the drain region than the source region in some embodiments. In some instances, the STI structure allows for more even distribution of mobile charge carriers (e.g., current) without increasing a lateral dimension of LDMOS transistor. In some embodiments, the STI structure also improves the breakdown voltage of the LDMOS transistor. However, because the STI structure increases a channel region path between the source and drain regions, the $R_{DS(on)}$ is higher because it takes longer for the channel region to form between the source and drain regions.

Various embodiments of the present disclosure relate to an LDMOS transistor comprising a gate electrode having a bowl-shape portion that extends into the STI structure to increase an accumulation area of mobile charge carriers (e.g., current) below the STI structure to reduce the $R_{DS(on)}$. In some embodiments, the bowl-shape portion of the gate electrode that extends into the STI structure is referred to as a "bowl-shape," meaning from a cross-sectional view, the bowl-shape portion of the gate electrode has an upper region that is wider than a lower region. The bowl-shape portion of the gate electrode advantageously does not change the dimensions of the LDMOS transistor.

In some embodiments, the bowl-shape portion of the gate electrode is spaced from a bottommost surface of the STI structure by a portion of the STI structure. In some embodiments, the bowl-shape portion of the gate electrode increases the accumulation of mobile charge carriers in the channel region below the bottommost surface of the STI structure and the bowl-shape portion of the gate electrode. Because of the higher accumulation of mobile charge carriers in the channel region below the bottommost surface of the STI structure and the bottommost surface of the bowl-shape portion of the gate electrode, the gate electrode can be more effective in turning the LDMOS transistor ON and OFF. Further, the narrower lower region of the bowl-shape portion of the gate electrode improves controllability of the accumulation area of mobile charge carriers to turn the LDMOS transistor ON and OFF. Thus, the bowl-shape portion of the gate electrode reduces the $R_{DS(on)}$ of the LDMOS transistor, thereby increasing switching speeds and reliability of the LDMOS transistor.

Figure 1:
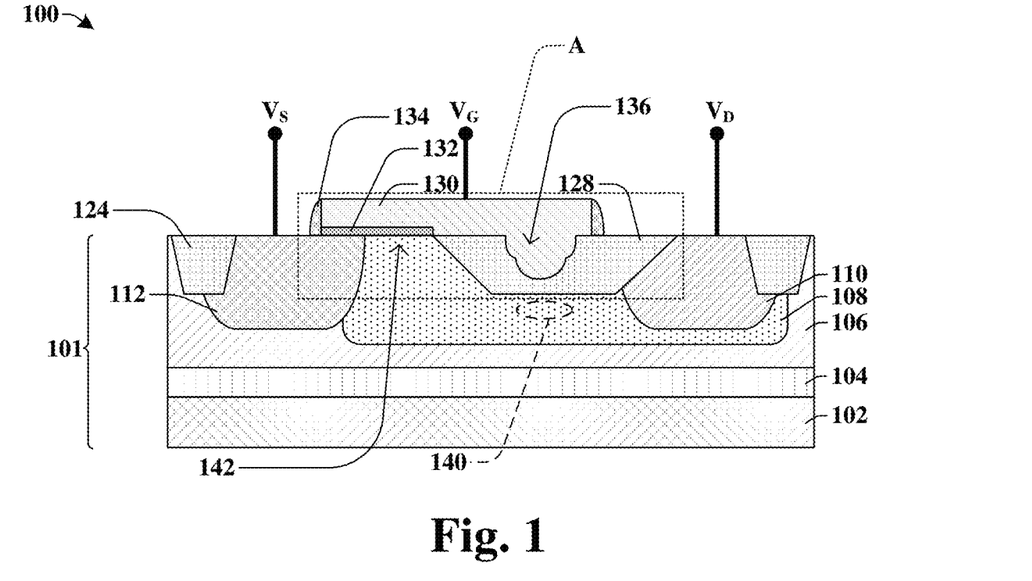
FIG. 1 illustrates a cross-sectional view of some embodiments of a laterally-diffused metal-oxide semiconductor (LDMOS) transistor comprising a gate electrode arranged over a substrate and a shallow trench isolation (STI) structure, wherein a portion of the gate electrode extends into the STI structure.

FIG. 1 illustrates a cross-sectional view 100 of some embodiments of a LDMOS transistor comprising a gate electrode having a portion that extends into an STI structure.

The cross-sectional view 100 of FIG. 1 includes a source region 112 and a drain region 110 arranged within a substrate 101. In some embodiments, the substrate 101 comprises various doped regions and/or layers of semiconductor materials (e.g., silicon, germanium, etc.). For example, in some embodiments, the substrate 101 may comprise a base substrate layer 102 having a first doping type (e.g., p-type or n-type). In some embodiments, a doped buried layer 104 is arranged over the base substrate layer 102 having a second doping type (e.g., n-type or p-type) different than the first doping type. In some embodiments, a bulk substrate layer 106 may be arranged over the doped buried layer 104 and have the first doping type (e.g., p-type or n-type) or may have the second doping type (e.g., n-type or p-type). In some embodiments, a portion of the bulk substrate layer 106 comprises a low doped drift region 108. In some embodiments, the low doped drift region 108 has the first doping type (e.g., p-type or n-type) or may have the second doping type (e.g., n-type or p-type). In some embodiments, wherein the bulk substrate layer 106 and the low doped drift region 108 comprise a same doping type, then the doping concentration of the low doped drift region 108 may be less than the doping concentration of the bulk substrate layer 106.

In some embodiments, the source region 112 and the drain region 110 may have a same doping type. In some other embodiments, the source region 112 has the first doping type (e.g., p-type or n-type), whereas the drain region 110 has the second doping type (e.g., n-type or p-type). In some embodiments, the drain and source regions 110, 112 have different doping concentrations than that of the low doped drift region 108 and the bulk substrate layer 106. In some other embodiments, the drain and source regions 110, 112 may also be arranged over the substrate 101. In some embodiments, the source region 112 is coupled to a source voltage terminal $V_S$, and the drain region 110 is coupled to a drain voltage terminal $V_D$, wherein control circuitry is configured to apply voltage(s) to the source and drain voltage terminals $V_S$, $V_D$ to turn the LDMOS transistor "ON" or "OFF."

In some embodiments, a gate electrode 130 is arranged over the substrate 101 and between the source region 112 and the drain region 110. The gate electrode 130 is coupled to and controlled by a gate voltage terminal $V_G$. In some embodiments, the gate electrode 130 is also arranged over a shallow trench isolation (STI) structure 128. In some embodiments, the STI structure 128 extends from a frontside of the substrate 101 towards a backside of the substrate 101. In some embodiments, the STI structure 128 extends into the low doped drift region 108 and is arranged between the source region 112 and the drain region 110. In some embodiments, the STI structure 128 is spaced from a bottommost surface of the low doped drift region 108 by a portion of the low doped drift region 108. In some embodiments, the STI structure 128 is arranged closer to the drain region 110 than the source region 112. In some embodiments, the STI structure 128 directly contracts the drain region 110. In some other embodiments, the STI structure 128 may be arranged closer to the source region 112 than the drain region 110. In yet other embodiments, the STI structure 128 may be spaced equally from the source and drain regions 112, 110.

In some embodiments, the STI structure 128 is spaced apart from the source region 112 by a portion 142 of the substrate 101. In some embodiments, the gate electrode 130 is arranged directly over the portion 142 of the substrate 101 but is spaced apart from the portion of the substrate 101 by a gate dielectric layer 132. In some embodiments, other portions of the gate electrode 130 that directly overlie the STI structure 128 also directly contact the STI structure 128. In some embodiments, a gate sidewall spacer 134 is arranged on an outermost sidewall of the gate electrode 130. In some embodiments, a portion of the gate electrode 130 directly overlies the source region 112 but is spaced apart from the source region 112 by the gate dielectric layer 132. Further, in some embodiments, an isolation structure 124 extends into the substrate 101 to electrically isolate the source region 112, the drain region 110, and the gate electrode 130 from other devices arranged on or within the substrate 101.

In some embodiments, an LDMOS transistor comprises the STI structure 128 between the source region 112 and the drain region 110 to allow for a more even distribution of mobile charge carriers (e.g., current) as mobile charge carriers flow through the low doped drift region 108 between the source region 112 and the drain region 110 when the LDMOS transistor is "ON." Thus, the STI structure 128 improves the breakdown voltage of the LDMOS transistor without increasing laterally dimensions of the LDMOS transistor thereby improving the longevity and reliability of the LDMOS transistor.

To further improve reliability of the LDMOS transistor, the gate electrode 120 comprises, in some embodiments, a bowl-shape portion 136 that extends below a topmost surface of the substrate 101 and into the STI structure 128. The bowl-shape portion 136 reduces the distance between the low doped drift region 108 and portions of the gate electrode 130 directly overlying the STI structure 128. Therefore, during operation of the LDMOS transistor, an accumulation area 140 of mobile charge carriers that is formed directly below the bowl-shape portion 136 of the gate electrode 130 improves the ability of the gate electrode 130 to turn the LDMOS transistor "ON" and "OFF." Thus, in some embodiments, the bowl-shape portion 136 of the gate electrode 130 reduces the "drain-source on resistance", or $R_{DS(on)}$, of the LDMOS transistor to improve the controllability, switching speeds, and reliability of the LDMOS transistor without increasing the lateral dimensions of the LDMOS transistor.

Figure 2:
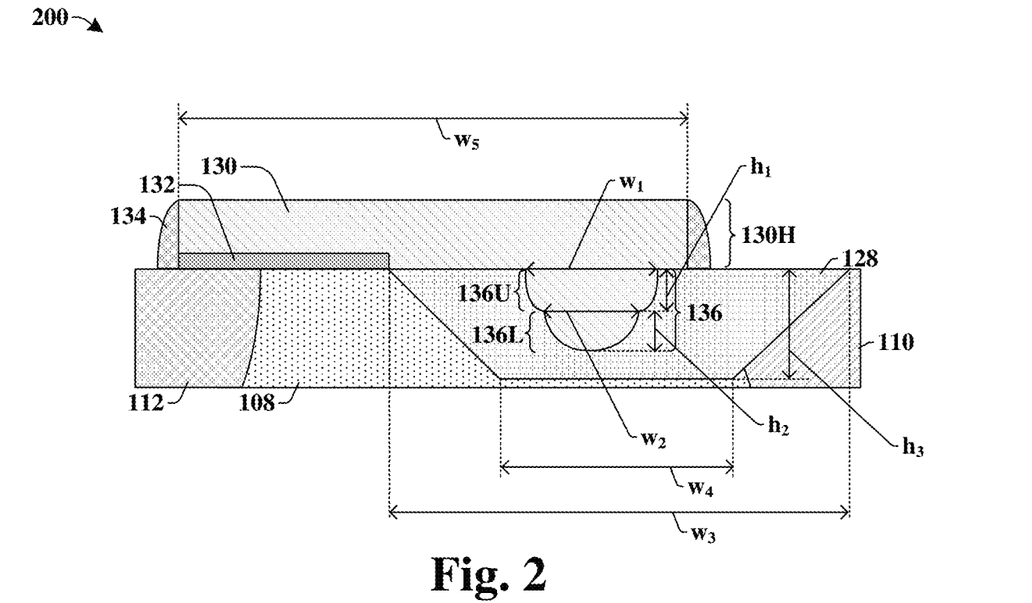
FIGS. 2 and 3 illustrate cross-sectional views of some embodiments of various profiles of a gate electrode comprising a portion that extends into an STI structure in a LDMOS transistor.

FIG. 2 illustrates a magnified, cross-sectional view 200 of some embodiments of the gate electrode 130 of FIG. 1.

In some embodiments, the magnified, cross-sectional view 200 of FIG. 2 corresponds to box A of the cross-sectional view 100 of FIG. 1. In some embodiments, the bowl-shape portion 136 is referred to as "bowl-shape" because from the cross-sectional view 200, the bowl-shape portion 136 comprises an upper region 136U that is wider than a lower region 136L arranged below the upper region 136U. Thus, in some embodiments, the gate electrode 130 comprises a horizontal portion 130H arranged over the substrate 101 and the bowl-shape portion 136 extending downward from the horizontal portion 130H and into the STI structure 128. In some such embodiments, the upper region 136U of the bowl-shape portion 136 is arranged directly between the lower region 136L of the bowl-shape portion 136 and the horizontal portion 130H of the gate electrode 130.

In some embodiments, all outer surfaces of the bowl-shape portion 136 of the gate electrode 130 are surrounded by the STI structure 128. In some embodiments, a bottommost surface of the bowl-shape portion 136 of the gate electrode 130, which is also a bottommost surface of the gate electrode 130, is arranged between a topmost surface and a bottommost surface of the STI structure 128. Further, in some embodiments, the bottommost surface of the bowl-shape portion 136 is spaced apart from the bottommost surface of the STI structure 128 by a portion of the STI structure 128. Thus, in some embodiments, the portion of the STI structure 128 separates the bowl-shape portion 136 of the gate electrode 130 from the low doped drift region 108.

In some embodiments, the gate electrode 130 comprises a conductive material or a semiconductor material. For example, in some embodiments, the gate electrode 130 comprises aluminum, copper, tungsten, titanium, tantalum, or some other suitable conductive material. For example, in some other embodiments, the gate electrode 130 comprises polysilicon, germanium, or some other suitable semiconductor material. In some embodiments, the STI structure 128, the gate dielectric layer 132, and the gate sidewall spacer 134 each comprise a same or different dielectric material configured to provide electrical isolation. For example, in some embodiments, the STI structure 128, the gate dielectric layer 132, and the gate sidewall spacer 134 may each comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), and/or the like.

In some embodiments, the upper region 136U of the bowl-shape portion 136 has a first width $w_1$ measured in the horizontal direction between outer sidewalls of the upper region 136U of the bowl-shape portion 136. In some embodiments, the first width $w_1$ decreases as the width is measured throughout a height of the upper region 136U of the bowl-shape portion 136. In some embodiments, an average value of the first width $w_1$ is in a range of between, for example, approximately 5 nanometers and approximately 50 nanometers. In some embodiments, the lower region 136L of the bowl-shape portion 136 has a second width $w_2$ measured in the horizontal direction between outer sidewalls of the lower region 136L of the bowl-shape portion 136. In some embodiments, the second width $w_2$ decreases as the width is measured throughout a height of the lower region 136L of the bowl-shape portion 136. In some embodiments, an average value of the second width $w_2$ is in a range of between, for example, approximately 5 nanometers and approximately 30 nanometers. Further, in some embodiments, the lower region 136L of the bowl-shape portion 136 has a semicircle-like profile from the cross-sectional view 200. In some embodiments, the upper region 136U of the bowl-shape portion 136 has substantially curved outer sidewalls.

The average value of the first width $w_1$ is greater than the average value of the second width $w_2$. Because the lower region 136L is narrower than the upper region 136U of the bowl-shape portion 136 of the gate electrode 130, the controllability of the accumulation area (140 of FIG. 1) of mobile charge carriers arranged below the bowl-shape portion 136 has a higher concentration of mobile charge carriers to better control switching the LDMOS transistor "ON" and "OFF" by reducing the $R_{DS(on)}$ of the LDMOS transistor.

In some embodiments, the upper region 136U of the bowl-shape portion 136 of the gate electrode 130 has a first height $h_1$ measured in the vertical direction from a topmost surface of the STI structure 128 to an interface between the upper region 136U and the lower region 136L of the bowl-shape portion 136. In some embodiments, the first height $h_1$ is in a range of between, for example, approximately 50 angstroms and approximately 500 angstroms. In some embodiments, the lower region 136L of the bowl-shape portion 136 of the gate electrode 130 has a second height $h_2$ measured in the vertical direction from the bottommost surface of the lower region 136L to the interface between the upper region 136U and the lower region 136L of the bowl-shape portion 136. In some embodiments, the second height $h_2$ is in a range of between, for example, approximately 50 angstroms and approximately 600 angstroms.

In some embodiments, the STI structure 128 has a third height $h_3$ measured in the vertical direction between topmost and bottommost surfaces of the STI structure 128. In some such embodiments, third height $h_3$ is in a range of between, approximately, 100 angstroms and approximately 3000 angstroms. In some embodiments, a sum of the first and second heights $h_1$, $h_2$ is less than the third height $h_3$ such that the bowl-shape portion 136 does not extend completely through the STI structure 128. In some embodiments, the STI structure 128 has a maximum width dimension $w_3$ in a range of between, for example, approximately 100 nanometers and approximately 400 nanometers. In some embodiments, the STI structure 128 has a minimum width dimension $w_4$ that is in a range of between, for example, approximately 15 nanometers and approximately 100 nanometers. In some embodiments, the horizontal portion 130H of the gate electrode 130 has a fifth width $w_5$ in a range of between, for example, approximately 0.5 micrometers and 5 micrometers.

Figure 3:
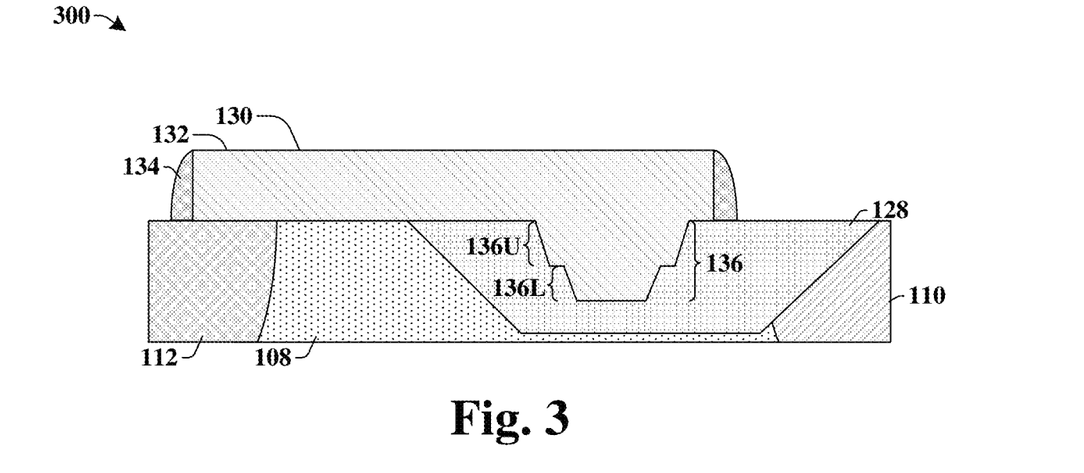

FIG. 3 illustrates a magnified, cross-sectional view 300 of some other embodiments of the gate electrode 130 of FIG. 1.

In some other embodiments, the lower region 136L of the bowl-shape portion 136 has a substantially trapezoidal-like profile from the cross-sectional view 300. In some other embodiments, the outer sidewalls of the upper region 136U and the lower region 136L of the bowl-shape portion 136 are substantially slanted from the cross-sectional view 300. In some instances, the difference between the profile of the bowl-shape portion 136 of FIG. 3 and of FIG. 2 depends on the etching processes used in forming the cavity in the STI structure 128 for formation of the gate electrode 130.

Figure 4A:
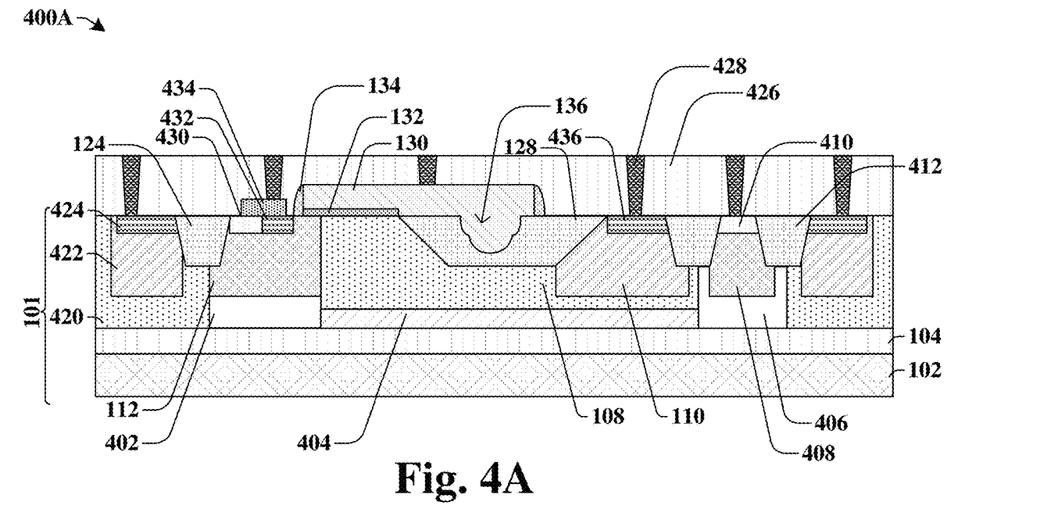
FIGS. 4A and 4B illustrate cross-sectional views of some other embodiments of a LDMOS transistor comprising a gate electrode that extends into an STI structure.

FIG. 4A illustrates a cross-sectional view 400A of some other embodiments of a LDMOS transistor comprising a gate electrode extending into a STI structure and comprising an interconnect structure coupled to the gate electrode.

In some embodiments, the LDMOS transistor is part of a power management integrated circuits (PMICs), bipolar CMOS DMOS (BCD) devices, and/or some other high-voltage device. In some such embodiments, the substrate 101 may comprise more doped regions and/or layers of semiconductor materials (e.g., silicon, germanium, etc.) than what is illustrated in FIG. 1, for example.

Thus, in some embodiments, the substrate 101 further comprises a deep well layer 404 arranged directly between the low doped drift region 108 and the doped buried layer 104. In some embodiments, the deep well layer 404 has a different doping type than the doped buried layer 104. In some embodiments, a first lightly doped layer 402 is arranged below the source region 112. In some such embodiments, the first lightly doped layer 402 may have a first lower doping concentration but a same doping type as the source region 112.

In some embodiments, highly concentrated doped regions are arranged within the source and drain regions (e.g., 112, 110). For example, in some embodiments, a main drain concentrated doped region 436 is arranged within a top portion of the drain region 110. In some such embodiments, the main drain concentrated doped region 436 has a same doping type as but a higher doping concentration than the drain region 110. In some embodiments, a first main source concentrated doped region 430 is arranged within a top portion of the source region 112, and a second main source concentrated doped region 432 is arranged within a top portion of the source region 112 and laterally beside the first main source concentrated doped region 430. In some embodiments, first main source concentrated doped region 430 has a same doping type as but a higher doping concentration than the source region 112. In some embodiments, the second main source concentrated doped region 432 has a different doping type than the source region 112. In some embodiments, a butted-source contact 434 is arranged over and electrically coupled to the first and second main source concentrated doped regions 430, 432.

In some embodiments, a BCD well region 420 is arranged beside the source region 112, and a BCD drain region 422 is arranged within the BCD well region 420. In some embodiments, the BCD drain region 422 has a same doping type but different doping concentration than the BCD well region 420. In some other embodiments, the BCD drain region 422 may have a different doping type than the BCD well region 420. In some embodiments, a BCD concentrated doped region 424 is arranged within a top portion of the BCD drain region 422 and has a higher concentration of a same doping type than the BCD drain region 422.

In some embodiments, a second lightly doped layer 406 is arranged over the doped buried layer 104 and beside the deep well layer 404 and the low doped drift region 108. In some embodiments, an additional source region 408 is arranged within the second lightly doped layer 406. In some embodiments, the additional source region 408 has a same doping type as but different doping concentration than the second lightly doped layer 406. In some embodiments, an additional source concentrated doped region 410 is arranged within a top portion of the additional source region 408. In some embodiments, the additional source concentrated doped region 410 has a same doping type as but a higher doping concentration than the additional source region 408. In some embodiments, an additional isolation structure 412 electrically isolates a portion of the BCD drain region 422 from a portion of the additional source region 408.

In some embodiments, regardless of the overall design of the doped regions and/or layers of the substrate 101 and device of FIG. 4A, the gate electrode 130 is arranged over the substrate 101, arranged between the source region 112 and the drain region 110, and comprises a bowl-shape portion 136 that extends below a topmost surface of the substrate 101 into the STI structure 128 that is arranged between the source region 112 and the drain region 110. Further, in some embodiments, an interconnect dielectric layer 426 is arranged over the substrate 101 and the gate electrode 130. In some embodiments, interconnect contact vias 428 are arranged within the interconnect dielectric layer 426 to electrically contract each of the source regions (e.g., 112, 408), each of the drain regions (e.g., 110, 422), and the gate electrode 130. In some embodiments, the interconnect contact vias 428 are coupled to other circuitry and/or devices such that various signals (e.g., current, voltage) can be applied to the LDMOS transistor through the interconnect contact vias 428 to turn the LDMOS transistor "ON" and "OFF."

Figure 4B:
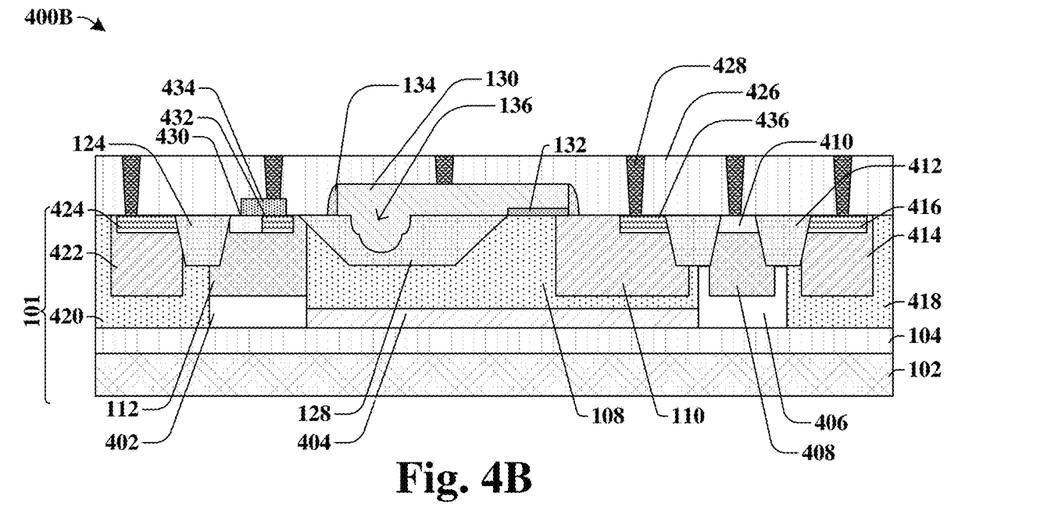

FIG. 4B illustrates a cross-sectional view 400B of some alternative embodiments of the LDMOS transistor of FIG. 4A.

In some other embodiments, the STI structure 128 and the bowl-shape portion 136 of the gate electrode 130 are arranged closer to the source region 112 than the drain region 110.

FIGS. 5-15 illustrate cross-sectional views 500-1500 of some embodiments of a method of forming an LDMOS transistor comprising a gate electrode having a portion that extends into an STI structure arranged between source and drain regions to improve controllability and reliability of the LDMOS transistor. Although FIGS. 5-15 are described in relation to a method, it will be appreciated that the structures disclosed in FIGS. 5-15 are not limited to such a method, but instead may stand alone as structures independent of the method.

Figure 5:
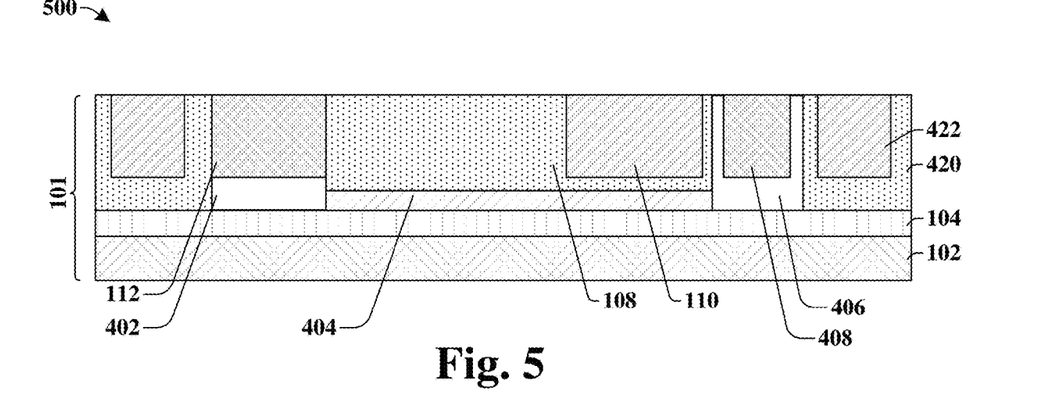
FIGS. 5-15 illustrate cross-sectional views of some embodiments of a method of forming a LDMOS transistor comprising a STI structure arranged between source and drain regions and comprising a gate electrode arranged over and extending into the STI structure.

As shown in cross-sectional view 500 of FIG. 5, a substrate 101 is provided. In some embodiments, the substrate 101 may comprise any type of semiconductor body (e.g., silicon/CMOS bulk, SiGe, silicon-on-insulator substrate, etc.) such as a semiconductor wafer or on or more die on a wafer, as well as any other type of semiconductor and/or epitaxial layers formed thereon and/or otherwise associated therewith. For example, in some embodiments, the substrate 101 comprises a base substrate layer 102, and a doped buried layer 104 arranged over the base substrate layer 102. In some embodiments, a deep well layer 404 is arranged over the doped buried layer 104 and is arranged between a first lightly doped layer 402 and a second lightly doped layer 406. In some embodiments, a low doped drift region 108 is arranged over the first lightly doped layer 402.

In some embodiments, a source region 112 is arranged beside the low doped drift region 108, above the first lightly doped layer 402 and beside a BCD well region 420. In some embodiments, the source region 112 is spaced apart from a drain region 110 by the low doped drift region 108. In some embodiments, the drain region 110 is arranged within the low doped drift region 108 and laterally beside the second lightly doped layer 406. In some embodiments, an additional source region 408 is arranged within the second lightly doped layer 406, and a BCD drain region 422 is arranged within the BCD well region 420.

Each of the above identified doped regions and/or layers of the substrate 101 may be formed through various forms of masking (e.g., photolithography processes), doping (e.g., ion implantation processes), deposition, and/or epitaxial growth processes. For example, in some embodiments, the substrate 101 may comprise multiple layers formed through epitaxial growth and doping processes. In some other embodiments, the substrate 101 may have been one single layer that was selectively doped to produce the structure in FIG. 5. Further, it will be appreciated that other configuration/designs of a substrate 101 than what is shown in FIG. 5 is also within the scope of this disclosure.

Figure 6:
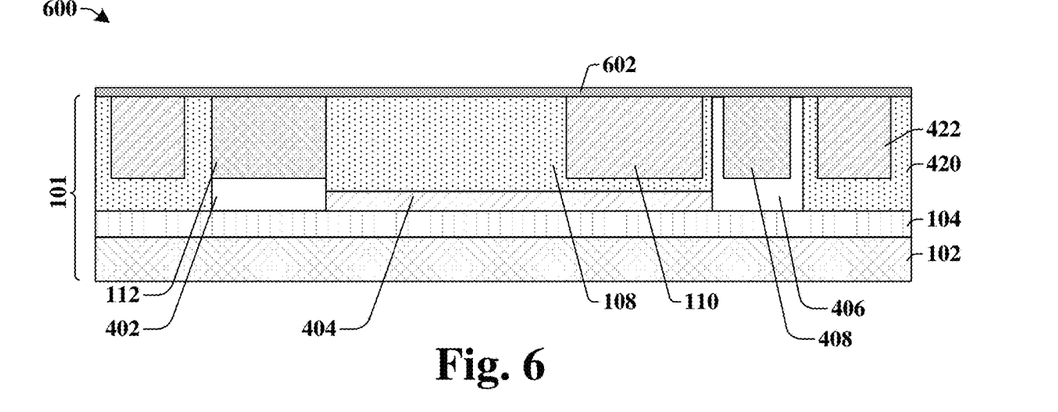

As shown in cross-sectional view 600 of FIG. 6, in some embodiments, a dielectric layer 602 is formed over the substrate 101. In some embodiments, the dielectric layer 602 is formed by a thermal oxidation process, a wet oxidation process, or some other deposition process (e.g., physical vapor deposition (PVD), chemical vapor deposition (CVD), atomic layer deposition (ALD), etc.). In some embodiments, the dielectric layer 602 comprises silicon dioxide. In some other embodiments, the dielectric layer 602 comprises some other dielectric material such as, for example, a nitride (e.g., silicon nitride, silicon oxynitride), a carbide (e.g., silicon carbide), an oxide, borosilicate glass (BSG), phosphoric silicate glass (PSG), borophosphosilicate glass (BPSG), a low-k oxide (e.g., a carbon doped oxide, SiCOH), or the like.

Figure 7:
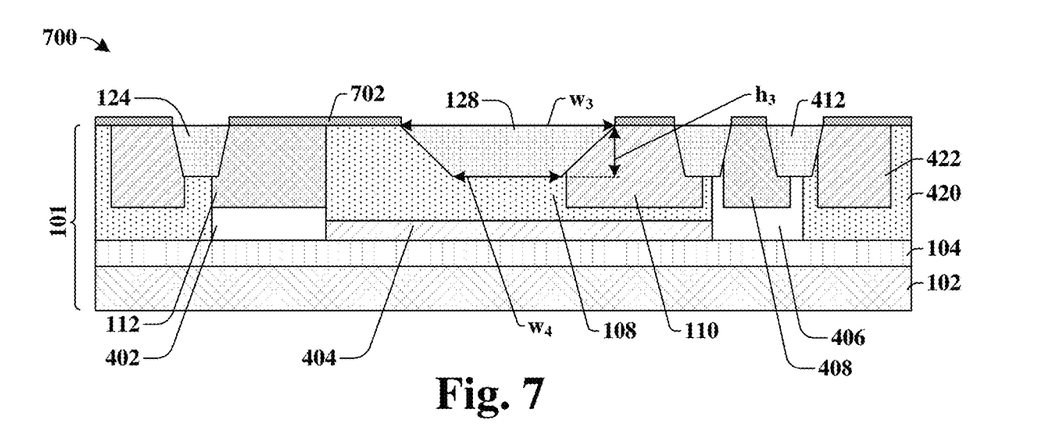

As shown in cross-sectional view 700 of FIG. 7, in some embodiments, a shallow trench isolation (STI) structure 128, an isolation structure 124, and an additional isolation structure 412 are formed within the substrate 101. In some embodiments, each of the STI structure 128, the isolation structure 124, and the additional isolation structure 412 are formed simultaneously through various steps comprising patterning processes (e.g., photolithography/etching), removal processes (e.g., wet etching, dry etching, chemical mechanical planarization (CMP)), and deposition processes (e.g., PVD, CVD, ALD, etc.).

For example, in some embodiments, a masking structure may be formed over the dielectric layer (602 of FIG. 6) comprising openings through a patterning process (e.g., photolithography/etching). In some embodiments, a removal process (e.g., wet etching, dry etching) may be performed to remove portions of the dielectric layer (602 of FIG. 6) and the substrate 101 according to the openings of the masking structure. Then, in some embodiments, an isolation material may be formed in each of the cavities within the substrate 101 to form the STI structure 128, the isolation structure 124, and the additional isolation structure 412. Thus, in some embodiments, the STI structure 128, the isolation structure 124, and the additional isolation structure 412 are arranged below openings in a patterned dielectric layer 702.

In some embodiments, the STI structure 128, the isolation structure 124, and the additional isolation structure 412 may each comprise silicon dioxide. In some other embodiments, the STI structure 128, the isolation structure 124, and the additional isolation structure 412 may comprise some other isolation material such as, for example, a nitride (e.g., silicon nitride, silicon oxynitride), a carbide (e.g., silicon carbide), an oxide, borosilicate glass (BSG), phosphoric silicate glass (PSG), borophosphosilicate glass (BPSG), a low-k oxide (e.g., a carbon doped oxide, SiCOH), or the like.

Further, in some embodiments, the STI structure 128 is formed within the low doped drift region 108 and between the source region 112 and the drain region 110. In some embodiments, the STI structure 128 is arranged between the source and drain regions 112, 110 to increase the length of a channel region path between the source and drain regions 112, 110 within the low doped drift region 108 thereby improving the breakdown voltage of the overall device. In some embodiments, the STI structure 128 is arranged closer to the drain region 110 than the source region 112. In some other embodiments, the STI structure 128 is arranged closer to the source region 112 than the drain region 110 (see, e.g., FIG. 4B). In some embodiments, the STI structure 128 extends into the substrate 101 to have a third height $h_3$. In some such embodiments, third height $h_3$ is in a range of between, approximately, 100 angstroms and approximately 3000 angstroms. In some embodiments, the STI structure 128 has a maximum width dimension $w_3$ in a range of between, for example, approximately 100 nanometers and approximately 400 nanometers. In some embodiments, the STI structure 128 has a minimum width dimension $w_4$ that is in a range of between, for example, approximately 15 nanometers and approximately 100 nanometers.

In some embodiments, the isolation structure 124 continuously surrounds the source region 112 and the drain region 110 to isolate the source and drain regions 112, 110 from other devices arranged on or within the substrate 101. Further, in some embodiments, the additional isolation structure 412 may be arranged between the additional source region 408 and the BCD drain region 422.

It will be appreciated that in some other embodiments, the STI structure 128, the isolation structure 124, and the additional isolation structure 412 may be formed within the substrate 101 first, and then the substrate 101 may be selectively doped as illustrated in FIG. 5. Further, in some other embodiments, the patterned dielectric layer 702 may be formed after the STI structure 128, the isolation structure 124, and the additional isolation structure 412.

Figure 8:
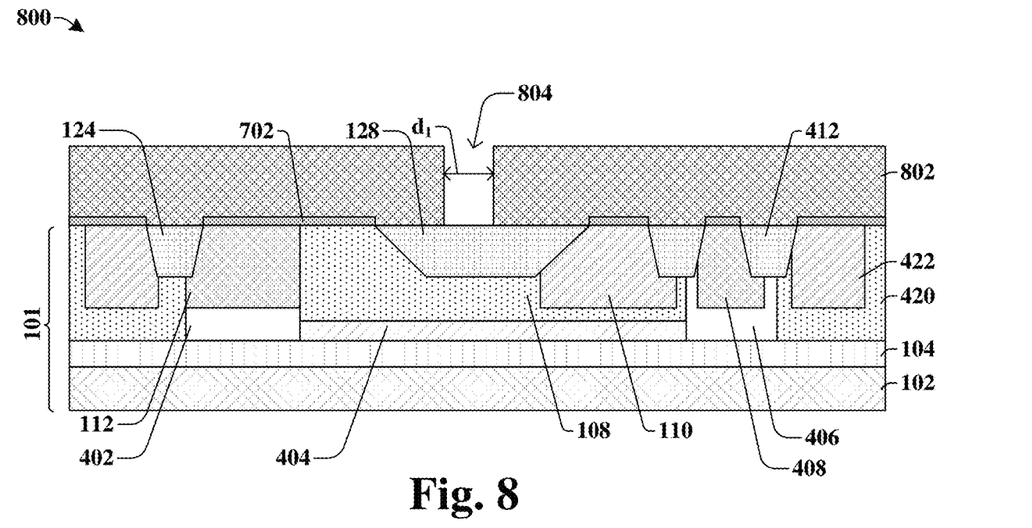

As shown in cross-sectional view 800 of FIG. 8, in some embodiments, a first mask structure 802 is formed over the substrate 101. In some embodiments, the first mask structure 802 may be formed through deposition (e.g., PVD, CVD, spin-on, etc.), photolithography, and removal (e.g., etching) processes. In some embodiments, the first mask structure 802 comprises a photoresist material or a hard mask material. In some embodiments, after the photolithography and removal (e.g., etching processes), the first mask structure 802 comprises a first opening 804. In some embodiments, the first opening 804 has a width equal to a first distance $d_1$. In some embodiments, the first opening 804 is arranged directly over the STI structure 128 to expose an upper surface of the STI structure 128. Thus, in some embodiments, the first distance $d_1$ of the first opening 804 is less than the maximum width dimension ($w_3$ of FIG. 7) of the STI structure 128. In some embodiments, the first distance $d_1$ may be in a range of between, for example, approximately 5 nanometers and approximately 25 nanometers.

Figure 9:
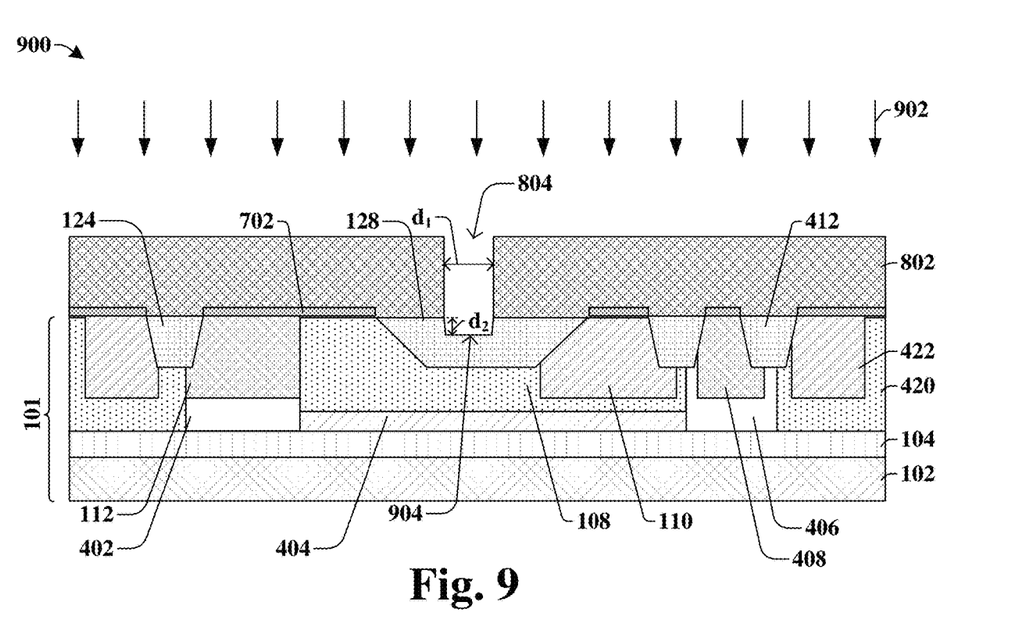

As shown in cross-sectional view 900 of FIG. 9, in some embodiments, a first removal process 902 is performed to remove a portion of the STI structure 128 according to the first opening 804 of the first mask structure 802 to form a first trench 904 in the STI structure 128. In some embodiments, the first removal process 902 comprises a dry etching process. In some embodiments, the first trench 904 formed within the STI structure 128 has a depth equal to a second distance $d_2$. In some embodiments, the first removal process 902 comprises the dry etching process such that the STI structure 128 is removed substantially in a vertical direction. In some embodiments, the second distance $d_2$ is controllable by controlling the time of the first removal process 902 such that an etch stop layer is not needed. In some embodiments, the second distance $d_2$ is less than the third height ($h_3$ of FIG. 7) of the STI structure 128 such that the first trench 904 has a lower surface defined by a surface of the STI structure 128. In some other embodiments, the second distance $d_2$ is in a range of between, for example, approximately 50 angstroms and approximately 500 angstroms.

Figure 10:
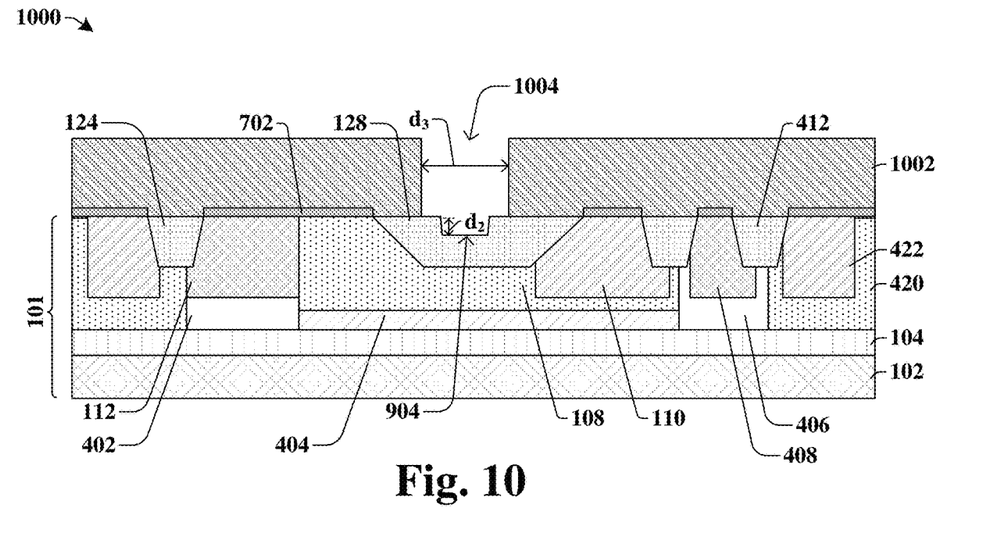

As shown in cross-sectional view 1000 of FIG. 10, the first mask structure (802 of FIG. 9) is removed from the substrate 101, and a second mask structure 1002 comprising a second opening 1004 is formed over the substrate 101. In some embodiments, the second mask structure 1002 is also formed by way of deposition (e.g., PVD, CVD, spin-on, etc.), photolithography, and removal (e.g., etching) processes. In some embodiments, the second mask structure 1002 is a completely different layer than the first mask structure (802 of FIG. 9). In some other embodiments, the second mask structure 1002 may instead be the same layer as the first mask structure (802 of FIG. 9), wherein the first opening (804 of FIG. 9) is increased through patterning processes (e.g., photolithography/etching) in width to form the second opening 1004 of FIG. 10. In some such other embodiments, the removal of the first mask structure (802 of FIG. 9) is omitted.

The second opening 1004 of the second mask structure 1002 is arranged directly over the first trench 904 of the STI structure 128 and also exposes upper surfaces of the STI structure 128. In some embodiments, the second opening 1004 has a width equal to a second distance $d_2$. In some embodiments, the second distance $d_2$ of the second opening 1004 is less than the maximum width dimension ($w_3$ of FIG. 7) of the STI structure 128. Further, the second distance $d_2$ of the second opening 1004 is greater than the first distance ($d_1$ of FIG. 8) of the first opening (804 of FIG. 8) of the first mask structure (802 of FIG. 8). In some embodiments, the third distance $d_3$ may be in a range of between, for example, approximately 5 nanometers and approximately 50 nanometers.

Figure 11:
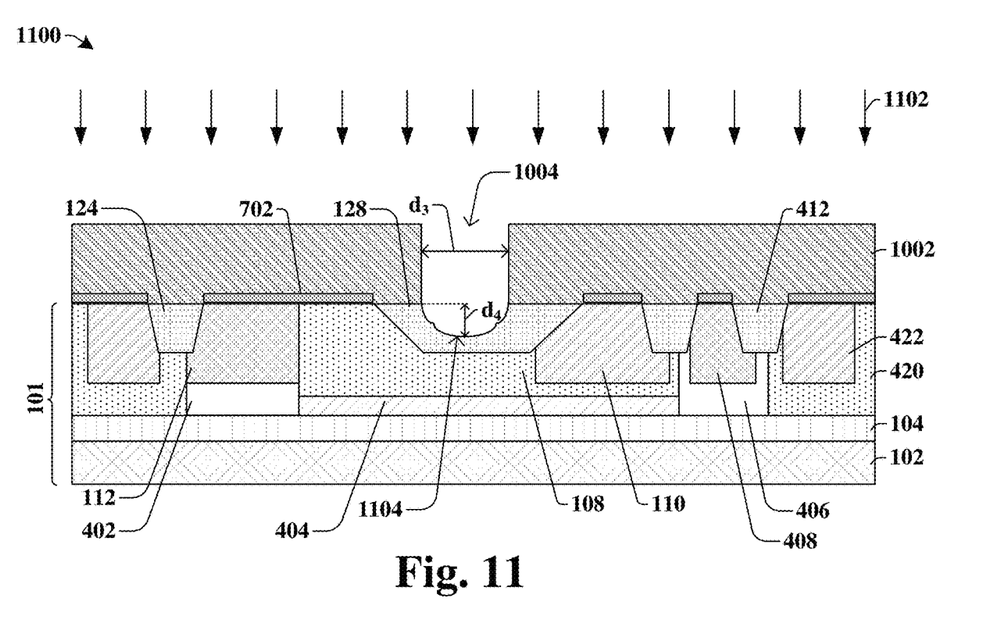

As shown in cross-sectional view 1100 of FIG. 11, in some embodiments, a second removal process 1102 is performed to further remove portions of the STI structure 128 according to the second opening 1004 of the second mask structure 1002 to increase the depth and width of the first trench (904 of FIG. 10) thereby forming a second trench 1104 in the STI structure 128. In some embodiments, the second removal process 1102 comprises a different type of etching process than the first removal process (902 of FIG. 9). For example, in some embodiments, the second removal process 1102 comprises a wet etching process such that the second removal process 1102 removes portions of the STI structure 128 in the vertical and horizontal directions. In some other embodiments, the second removal process 1102 may comprise an isotropic dry etching process to remove portions of the STI structure 128 in the vertical and horizontal directions.

In some embodiments, the second trench 1104 has a depth measured from the top surface of the STI structure 128 that is equal to a fourth distance $d_4$. In some embodiments, the fourth distance $d_4$ is in a range of between, for example, approximately 100 angstroms and approximately 1100 angstroms. The second removal process 1102 is controlled such that after the second removal process 1102, the fourth distance $d_4$ is less than the depth (e.g., the third height $h_3$ of FIG. 7) of the STI structure 128. Thus, after the second removal process 1102, the STI structure 128 comprises the second trench 1104, wherein bottommost surfaces and outer sidewalls of the second trench 1104 are defined by surfaces of the STI structure 128.

In some embodiments, after the second removal process 1102, the second trench 1104 exhibits a "bowl-shape" profile, meaning an upper portion of the second trench 1104 is wider than a lower portion of the second trench 1104. Further, in some embodiments, the second trench 1104 has substantially curved outer sidewalls. In some embodiments, the upper portion of the second trench 1104 has a depth defined by the first removal process (902 of FIG. 9) but a width defined by the second masking structure 1002 and the second removal process 1102. In some embodiments, the lower portion of the second trench 1104 has a width defined by the first masking structure (802 of FIG. 9), the first removal process (902 of FIG. 9) and the second removal process 1102, whereas the lower portion of the second trench 1104 has a depth defined by the second removal process 1102.

Figure 12:
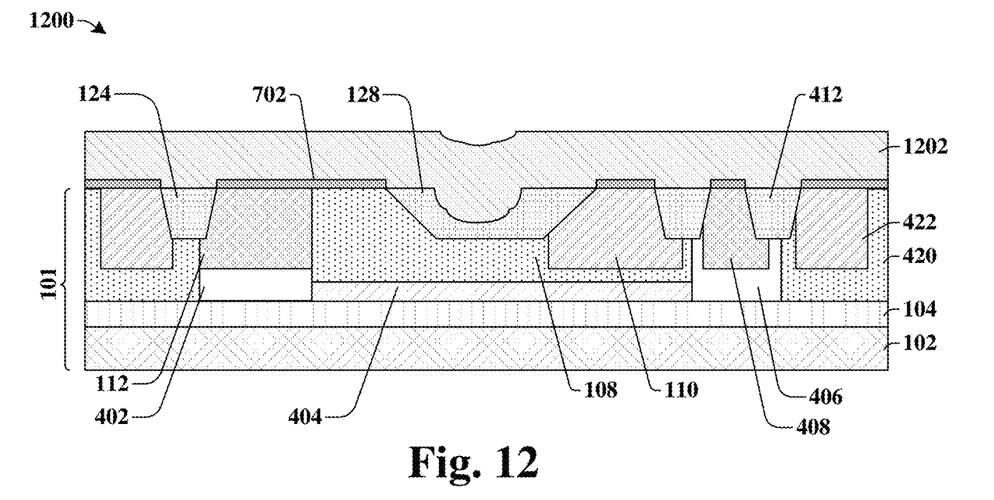

As shown in cross-sectional view 1200 of FIG. 12, in some embodiments, a gate material 1202 is formed over the substrate 101 and within the second trench (1104 of FIG. 11) of the STI structure 128. In some embodiments, the gate material 1202 comprises a semiconductor material such as, for example, polysilicon. In some other embodiments, the gate material 1202 comprises a conductive material such as, for example, aluminum, copper, tungsten, titanium, tantalum, or some other suitable conductive material. In some embodiments, the gate material 1202 is formed by way of a deposition process (e.g., PVD, CVD, ALD, sputtering, etc.). In some embodiments, the gate material 1202 has a thickness greater than the fourth distance ($d_4$ of FIG. 11) of the second trench (1104 of FIG. 11) of the STI structure 128 such that the gate material 1202 completely fills and extends above the second trench (1104 of FIG. 11) of the STI structure 128.

Figure 13:
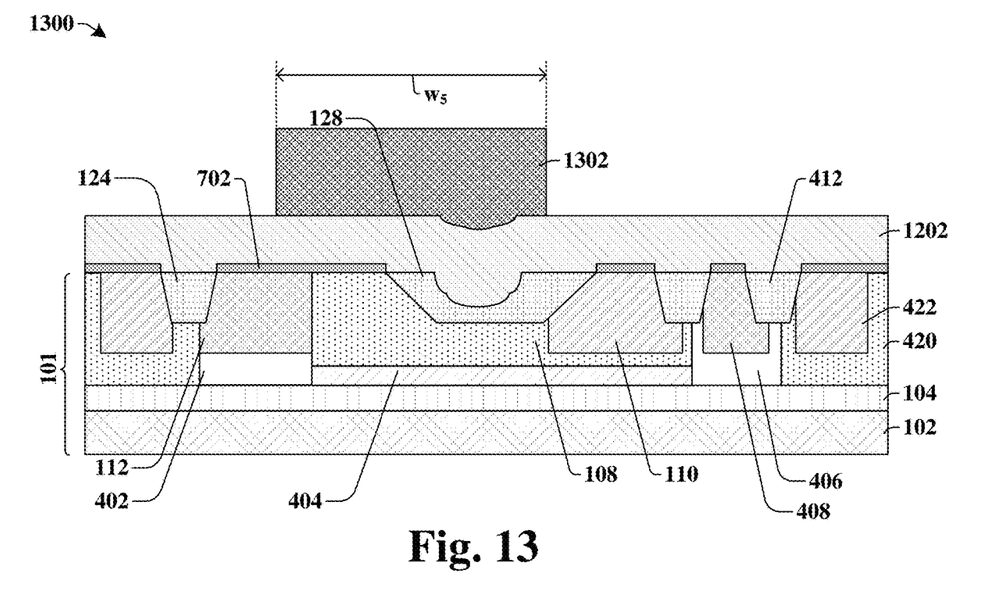

As shown in cross-sectional view 1300 of FIG. 13, in some embodiments, a third mask structure 1302 is formed over the gate material 1202. In some embodiments, the third mask structure 1302 is formed through deposition (e.g., PVD, CVD, spin-on, etc.), photolithography, and removal (e.g., etching) processes. In some embodiments, the third mask structure 1302 comprises a photoresist material or a hard mask material. In some embodiments, the third mask structure 1302 directly overlies at least a portion of the STI structure 128 and the second trench (1104 of FIG. 11) of the STI structure 128. In some embodiments, the third mask structure 1302 also directly overlies a portion of the source region 112. In some other embodiments, the third mask structure 1302 may directly overlie a portion of the drain region 110.

Figure 14:
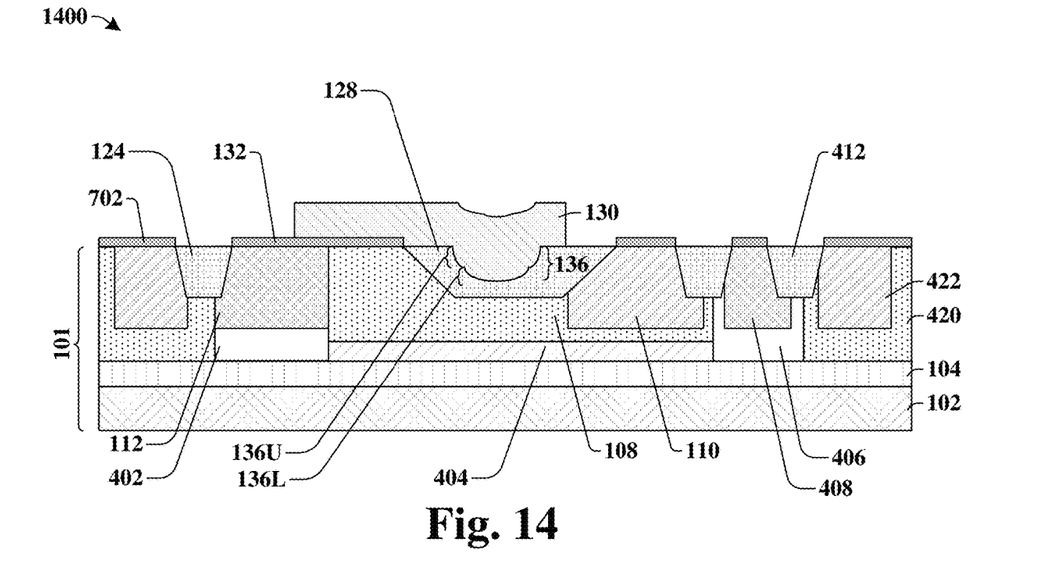

As shown in cross-sectional view 1400 of FIG. 14, in some embodiments, a removal process is performed according to the third mask structure (1302 of FIG. 13) to remove portions of the gate material (1202 of FIG. 13) that do not directly underlie the third mask structure (1302 of FIG. 13). After the removal process of FIG. 14, remaining portions of the gate material (1202 of FIG. 13) form a gate electrode 130 that directly overlies the STI structure 128 and comprises a bowl-shape portion 136 extending below the top surface of the STI structure 128 and within the second trench (1104 of FIG. 11) of the STI structure 128. In some embodiments, the bowl-shape portion 136 comprises an upper region 136U that is continuously connected to and is wider than a lower region 136L.

Further, in some embodiments, a portion of the patterned dielectric layer 702 separates the gate electrode 130 from directly contacting the low doped drift region 108. In some embodiments, such portion of the patterned dielectric layer 702 separating the gate electrode 130 from the low doped drift region 108 is a gate dielectric layer 132. In some embodiments, after the removal process of FIG. 14, a cleaning process, such as, for example, a Caroz clean is performed to the patterned dielectric layer 702, the isolation structure 124, the additional isolation structure 412, and/or other surfaces of the substrate 101. In some embodiments (not shown), a planarization process (e.g., CMP) may be performed before or after the removal process of FIG. 14 to planarize a topmost surface of the gate electrode 130.

Figure 15:
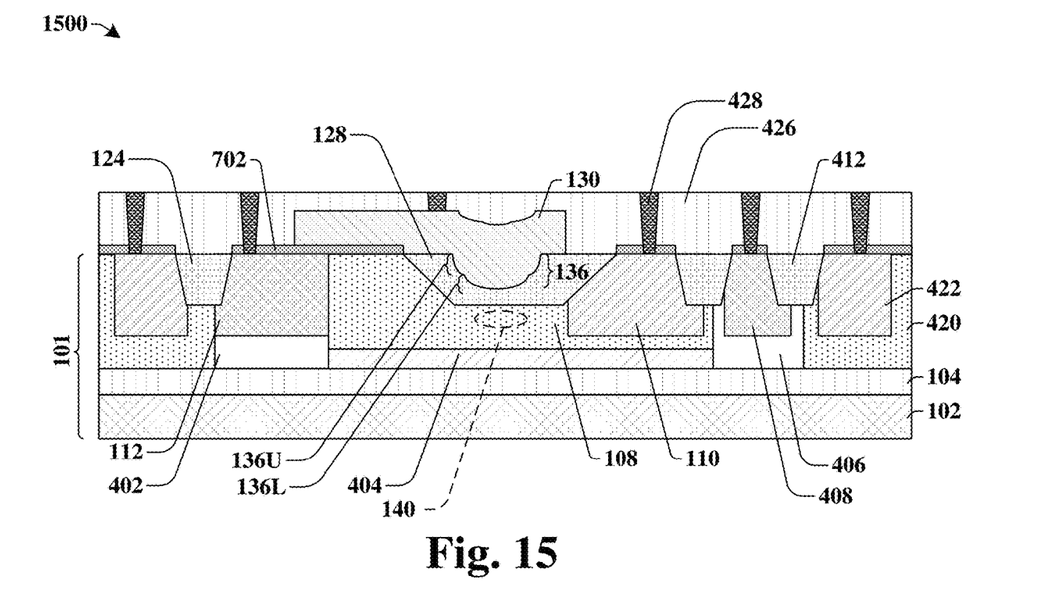

As shown in cross-sectional view 1500 of FIG. 15, in some embodiments, an interconnect dielectric layer 426 is formed over the substrate 101 and the gate electrode 130, and interconnect contact vias 428 are formed within the interconnect dielectric layer 426. In some embodiments, the interconnect dielectric layer 426 is formed through a deposition process (e.g., PVD, CVD, ALD, etc.). In some embodiments, the interconnect dielectric layer 426 may comprise, a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), and/or the like. In some embodiments, the interconnect dielectric layer 426 fills the groove in the topmost surface of the gate electrode 130. In some embodiments, the interconnect contact vias 428 are formed through various steps comprising patterning processes (e.g., photolithography/etching), removal processes (e.g., wet etching, dry etching, CMP), and deposition processes (e.g., PVD, CVD, ALD, sputtering, etc.). In some embodiments, the interconnect contact vias 428 extend through the interconnect dielectric layer 426 to contact the gate electrode 130, the various source regions (e.g., 112, 408), and the various drain regions (e.g., 110, 422). In some embodiments, the interconnect contact vias 428 comprise a conductive material such as, for example, tungsten, aluminum, copper, titanium, tantalum, or some other suitable conductive material.

In some embodiments, signals (e.g., current, voltage) are applied to at least the source region 112, the gate electrode 130, and the drain region 110 by control circuitry (not shown) to turn the LDMOS transistor "ON." The LDMOS transistor is turned "ON" when a sufficient voltage bias is applied across the LDMOS transistor such that mobile charge carriers flow through the low doped drift region 108 between the source region 112 and the drain region 110 along a channel region path. In some embodiments, the channel region path is increased in length due to the STI structure 128 to improve a breakdown voltage of the LDMOS transistor. In some embodiments, because the bowl-shape portion 136 of the gate electrode 130 extends into the STI structure 128, the bowl-shape portion 136 of the gate electrode 130 increases the amount of mobile charge carriers that collect in an accumulation area 140 arranged directly below the bowl-shape portion 136 in the low doped drift region 108. In some embodiments, the increase in the accumulation area 140 due to the bowl-shape portion 136 improves the ability of the gate electrode 130 to turn the LDMOS transistor "ON" and "OFF." Thus, in some embodiments, the bowl-shape portion 136 of the gate electrode 130 reduces the "drain-source on resistance", or $R_{DS(on)}$, of the LDMOS transistor to improve the controllability and reliability of the LDMOS transistor without increasing the lateral dimensions of the LDMOS transistor.

Figure 16:
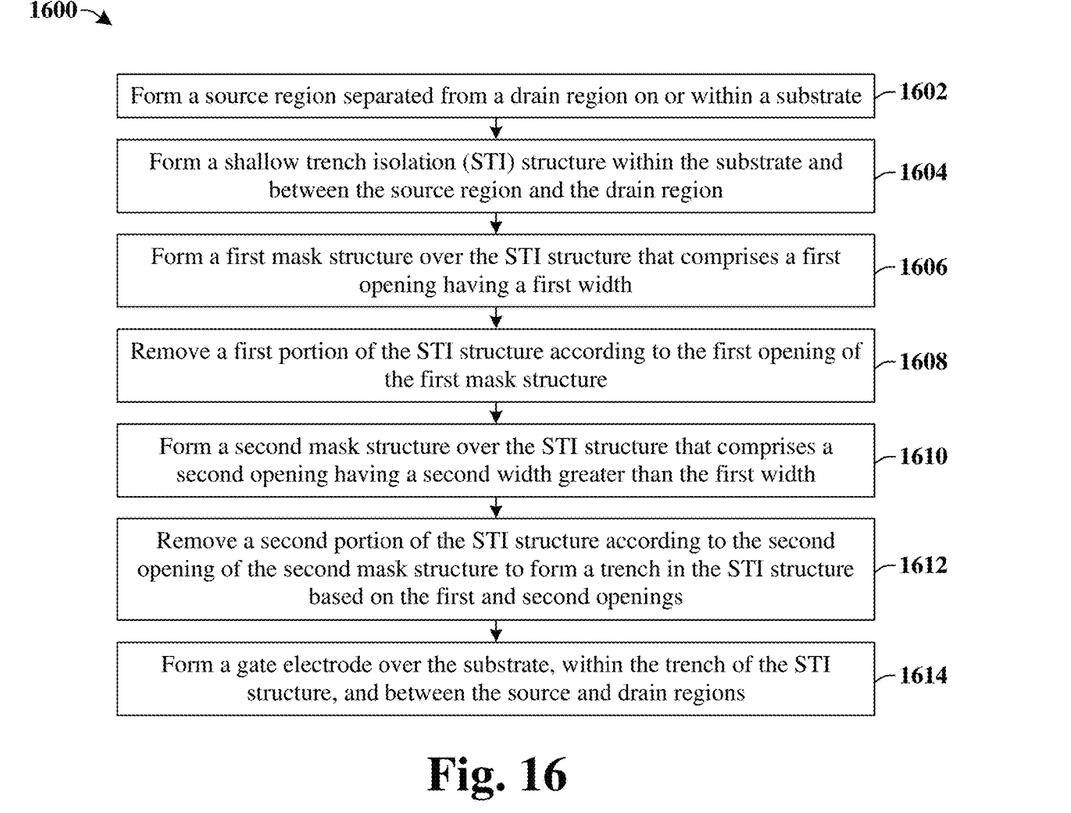
FIG. 16 illustrates a flow diagram of some embodiments of a method corresponding to the method of FIGS. 5-15.

FIG. 16 illustrates a flow diagram of some embodiments of a method 1600 corresponding to the method illustrated in FIGS. 5-15.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a source region separated from a drain region is formed on or within a substrate. FIG. 5 illustrates a cross-sectional view 500 of some embodiments corresponding to act 1602.

At act 1604, a shallow trench isolation (STI) structure is formed within the substrate and between the source and drain regions. FIG. 7 illustrates a cross-sectional view 700 of some embodiments corresponding to act 1604.

At act 1606, a first mask structure is formed over the STI structure and comprises a first opening having a first width. FIG. 8 illustrates a cross-sectional view 800 of some embodiments corresponding to act 1606.

At act 1608, a first portion of the STI structure is removed according to the first opening of the first mask structure. FIG. 9 illustrates a cross-sectional view 900 of some embodiments corresponding to act 1608.

At act 1610, a second mask structure is formed over the STI structure and comprises a second opening having a second width greater than the first width. FIG. 10 illustrates a cross-sectional view 1000 of some embodiments corresponding to act 1610.

At act 1612, a second portion of the STI structure is removed according to the second opening of the second mask structure to form a trench in the STI structure based on the first and second openings. FIG. 11 illustrates a cross-sectional view 1100 of some embodiments corresponding to act 1612.

At act 1614, a gate electrode is formed over the substrate, within the trench of the STI structure, and between the source and drain regions. FIG. 14 illustrates a cross-sectional view 1400 of some embodiments corresponding to act 1614.

Therefore, the present disclosure relates to a LDMOS transistor comprising a gate electrode arranged over and extending into a STI structure, wherein the STI structure and the gate electrode are arranged between the source and drain regions to reduce the drain-source on resistance of the LDMOS transistor and improve controllability and reliability of the LDMOS transistor.

Accordingly, in some embodiments, the present disclosure relates to an integrated chip comprising: a source region arranged over and/or within a substrate; a drain region arranged over and/or within the substrate; a shallow trench isolation (STI) structure arranged within the substrate and between the source and drain regions; and a gate electrode arranged over the substrate, over the STI structure, and between the source and drain regions, wherein a portion of the gate electrode extends into the STI structure such that a bottommost surface of the portion of the gate electrode is arranged between a topmost surface of the STI structure and a bottommost surface of the STI structure.

In other embodiments, the present disclosure relates to an integrated chip comprising: a source region arranged over and/or within a substrate; a drain region arranged over and/or within the substrate; a shallow trench isolation (STI) structure arranged within the substrate and between the source and drain regions; and a gate electrode arranged over the substrate, over the STI structure, and between the source and drain regions, wherein the gate electrode comprises: a bowl shape portion extending into the STI structure, wherein a bottommost surface of the bowl shape portion is spaced apart from a bottommost surface of the STI structure by a portion of the STI structure, and wherein the bowl shape portion comprises: an upper region arranged over and continuously connected to a lower region, wherein the upper region of the bowl shape portion of the gate electrode has a larger average width than an average width of the lower region of the bowl shape portion of the gate electrode.

In yet other embodiments, the present disclosure relates to a method comprising: forming a source region separated from a drain region on or within a substrate; forming a shallow trench isolation (STI) structure within the substrate and between the source region and the drain region; forming a first mask structure over the STI structure that comprises a first opening having a first width; removing a first portion of the STI structure according to the first opening of the first mask structure; forming a second mask structure over the STI structure that comprises a second opening having a second width greater than the first width; removing a second portion of the STI structure according to the second opening of the second mask structure to form a trench in the STI structure based on the first and second openings; and forming a gate electrode over the substrate, within the trench of the STI structure, and between the source and drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a source region arranged over and/or within a substrate;
a drain region arranged over and/or within the substrate;
a shallow trench isolation (STI) structure arranged within the substrate and between the source and drain regions;
a gate electrode arranged over the substrate, over the STI structure, and between the source and drain regions; and
a gate dielectric layer underlying the gate electrode and separating the gate electrode from the substrate;
wherein a portion of the gate electrode extends into the STI structure such that a bottommost surface of the portion of the gate electrode is arranged between a topmost surface of the STI structure and a bottommost surface of the STI structure,
wherein the portion of the gate electrode is directly between the source and drain regions,
wherein semiconductor material of the substrate is continuous from the source region to the drain region,
wherein the portion of the gate electrode decreases continuously in width from a first elevation level with a bottommost surface of the gate dielectric layer to a second elevation recessed relative to the first elevation, and
wherein the portion decreases continuously in width from the second elevation to a third elevation level with a bottommost point of the gate electrode.

2. The integrated chip of claim 1, wherein the STI structure is arranged closer to the drain region than the source region.

3. The integrated chip of claim 1, wherein a lower region of the portion of the gate electrode has a semicircle-like profile, and wherein an upper region of the portion of the gate electrode has outer sidewalls that are curved.

4. The integrated chip of claim 1, wherein a lower region of the portion of the gate electrode has a trapezoidal-like profile, and wherein an upper region of the portion of the gate electrode has outer sidewalls that are slanted.

5. The integrated chip of claim 1, wherein all surfaces defining the portion of the gate electrode are completely surrounded by the STI structure.

6. The integrated chip of claim 1, wherein the bottommost point of the gate electrode is at the bottommost surface of the portion of the gate electrode and is level with the drain and source regions.

7. The integrated chip of claim 1, wherein the portion of the gate electrode is bowl shaped.

8. An integrated chip comprising:
a source region arranged over and/or within a substrate;
a drain region arranged over and/or within the substrate and spaced from the source region in a first direction;
a shallow trench isolation (STI) structure arranged within the substrate and between the source and drain regions; and
a gate electrode arranged over the substrate, over the STI structure, and between the source and drain regions, wherein the gate electrode comprises:
a bowl shape portion extending into the STI structure, wherein a bottommost surface of the bowl shape portion is spaced apart from a bottommost surface of the STI structure by a portion of the STI structure, and wherein the bowl shape portion comprises:
a lower region; and
an upper region arranged over and continuously connected to the lower region, wherein the upper region of the bowl shape portion of the gate electrode has a larger average width than an average width of the lower region of the bowl shape portion of the gate electrode, wherein the upper region decreases in width continuously from a topmost surface of the STI structure to a first elevation level with a topmost edge of the lower region, and wherein the width extends parallel to the first direction.

9. The integrated chip of claim 8, further comprising:
a gate dielectric layer arranged directly on the substrate, vertically between the substrate and the gate electrode, and horizontally between the source region and the STI structure.

10. The integrated chip of claim 8, wherein the bowl shape portion of the gate electrode is arranged closer to the drain region than the source region.

11. The integrated chip of claim 8, wherein the upper and lower regions of the bowl shape portion of the gate electrode have substantially curved outer sidewalls.

12. The integrated chip of claim 8, wherein the lower region decreases in width from the topmost edge to a second elevation level with a bottommost point of the gate electrode.

13. The integrated chip of claim 8, wherein the source region, the drain region, and the bowl shape portion overlap with a common axis.

14. The integrated chip of claim 8, wherein the bowl shape portion has a maximum width at the topmost surface of the STI structure and a minimum width at a bottommost surface of the gate electrode.

15. The integrated chip of claim 8, wherein all surfaces defining the bowl shape portion of the gate electrode are completely surrounded by the STI structure.

16. A method comprising:
forming a source region separated from a drain region on or within a substrate;
forming a shallow trench isolation (STI) structure within the substrate and between the source region and the drain region;

forming a first mask structure over the STI structure that comprises a first opening having a first width;

removing a first portion of the STI structure according to the first opening of the first mask structure;

forming a second mask structure over the STI structure that comprises a second opening having a second width greater than the first width;

removing a second portion of the STI structure according to the second opening of the second mask structure to form a trench in the STI structure based on the first and second openings; and forming a gate electrode over the substrate, within the trench of the STI structure, and between the source and drain regions.

17. The method of claim 16, wherein the first portion of the STI structure is removed using a dry etching process, and wherein the second portion of the STI structure is removed using a wet etching process.

18. The method of claim 16, wherein the STI structure is arranged closer to the drain region than the source region.

19. The method of claim 18, wherein the source region is spaced apart from the STI structure by a portion of the substrate.

20. The method of claim 19, wherein the portion of the substrate is arranged directly below the gate electrode.

* * * * *